(12) United States Patent
Tan et al.

(10) Patent No.: US 7,428,153 B2
(45) Date of Patent: Sep. 23, 2008

(54) HEAT DISSIPATION ASSEMBLY

(75) Inventors: Li-Kuang Tan, Tu-Cheng (TW);
Yeu-Lih Lin, Tu-Cheng (TW);
Tseng-Hsiang Hu, Tu-Cheng (TW)

(73) Assignee: Foxconn Technology Co., Ltd.,
Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/309,219

(22) Filed: Jul. 13, 2006

(65) Prior Publication Data

US 2007/0121301 A1 May 31, 2007

(30) Foreign Application Priority Data

Nov. 25, 2005 (TW) .............................. 94141495 A

(51) Int. Cl.
*H05K 7/20* (2006.01)
*F28F 7/00* (2006.01)

(52) U.S. Cl. ................. 361/700; 165/104.33; 165/80.3; 361/697

(58) Field of Classification Search ................. 361/700, 361/697; 165/104.33
See application file for complete search history.

(56) References Cited

U.S. PATENT DOCUMENTS

| 6,415,853 | B1 | 7/2002 | Tao et al. | |
| 6,768,641 | B2 * | 7/2004 | Li | 361/719 |
| 6,822,870 | B2 * | 11/2004 | Hong et al. | 361/704 |
| 6,940,716 | B1 * | 9/2005 | Korinsky et al. | 361/695 |
| 7,040,384 | B2 * | 5/2006 | Shiang-Chich | 165/122 |
| 2006/0067050 | A1 * | 3/2006 | Li et al. | 361/697 |
| 2006/0221570 | A1 * | 10/2006 | Yang et al. | 361/697 |
| 2006/0238979 | A1 * | 10/2006 | Liu | 361/699 |

FOREIGN PATENT DOCUMENTS

CN   2580509 Y   10/2003

* cited by examiner

*Primary Examiner*—Gregory D Thompson
(74) *Attorney, Agent, or Firm*—Frank R. Niranjan

(57) ABSTRACT

A heat dissipation assembly used for dissipating heat from heat generating electronic components includes a mounting frame, a heat sink and a fan duct. The heat sink is positioned on the mounting frame; the fan duct is attached to the heat sink. The fan duct includes a plurality of first clamping portions, and the mounting frame includes a plurality of second clamping portions corresponding to the first clamping portions. The first clamping portions engage with the second clamping portions to fix the fan duct and the heat sink onto the mounting frame.

12 Claims, 4 Drawing Sheets

HEAT DISSIPATION ASSEMBLY

FIELD OF THE INVENTION

The present invention relates generally to a heat dissipation assembly, and more particularly to a heat dissipation assembly for dissipating heat generated by electronic components.

DESCRIPTION OF RELATED ART

With the development of electronics technology, modern electronic devices such as central processing units (CPUs) of computers have increasingly begun to operate at such high speeds that they generate large amounts of heat. The heat must be removed from the CPU quickly; otherwise, the component may overheat. Typically, a highly thermally conductive heat sink is mounted onto the CPU and a fan is mounted onto the heat sink for generating a forced airflow through the heat sink to help a quick removal of the heat from the heat sink.

In order to fix the fan in place, generally a fan holder or a fan duct is used to attach the fan to the heat sink to form a heat dissipation assembly. A clip is frequently used to fasten the heat dissipation assembly to the CPU. For example, U.S. Pat. No. 6,415,853 provides such a heat dissipation assembly for dissipating heat generated by a CPU. The heat dissipation assembly includes a fan duct, a mounting frame, a clip and a heat sink. In assembly, the clip is placed in a groove of the heat sink, and then the fan duct is attached to the heat sink by four screws. The heat dissipation assembly is placed on the surface of the CPU, and the clip is pressed downwards to engage the heat dissipation assembly to the mounting frame. However, a clip is needed in this example in order to secure the heat dissipation assembly; thus, the number of components in the heat dissipation assembly is increased, and tools are needed to operate the clip. Assembling and disassembling of the heat dissipation assembly is laborious and awkward.

Therefore, it is necessary to provide a heat dissipation assembly for electronic components which can be assembled or disassembled easily.

SUMMARY OF THE INVENTION

The heat dissipation assembly configured for dissipating heat from heat generating electronic components includes a mounting frame, a heat sink and a fan duct. The heat sink is positioned on the mounting frame; the fan duct is attached to the heat sink. The fan duct includes a plurality of first clamping portions, and the mounting frame includes a plurality of second clamping portions corresponding to the first clamping portions. The first clamping portions engage with the second clamping portions to fix the fan duct and the heat sink onto the mounting frame.

BRIEF DESCRIPTION OF THE DRAWINGS

Other advantages and novel features will become more apparent from the following detailed description of preferred embodiments when taken in conjunction with the accompanying drawings. The components in the drawings are not necessarily drawn to scale, the emphasis instead being placed upon clearly illustrating the principles of the present apparatus and method. Moreover, in the drawings, like reference numerals designate corresponding parts throughout the several views, in which.

DETAILED DESCRIPTION OF THE INVENTION

Figure 1:
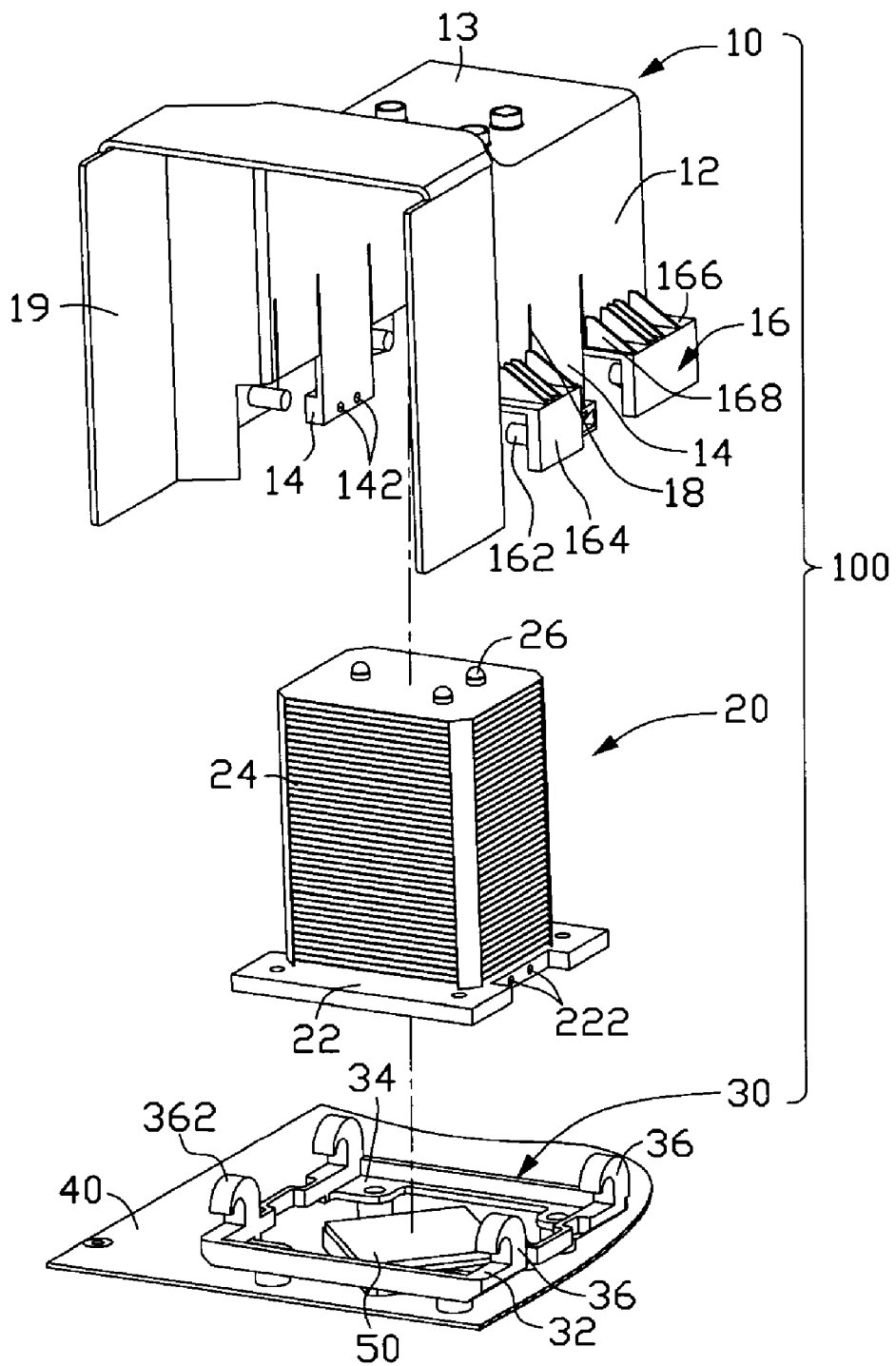
FIG. 1 is an exploded, isometric view of a heat dissipation assembly according to a preferred embodiment of the present invention.

Referring to FIGS. 1 through 4, a heat dissipation assembly 100 according to a preferred embodiment of the present invention is shown. The heat dissipation assembly 100 includes a fan duct 10, a heat sink 20 and a mounting frame 30. The heat sink 20 is positioned on the mounting frame 30; the fan duct 10 is attached to the heat sink 20. The fan duct 10 includes a plurality of first clamping portions 162, and the mounting frame 30 includes a plurality of second clamping portions 36 corresponding to the first clamping portions 162. Each of the first clamping portions 162 engages with a corresponding second clamping portion 36 to fix the fan duct 10 and the heat sink 20 onto the mounting frame 30.

The fan duct 10 includes a top plate 13, and two side plates 12 extending from opposing sides of the top plate 13. A connecting portion 14 extends downwardly from a bottom portion of a middle of each side plate 12. A pair of through holes 142 are defined in each of the connecting portions 14. Being located at each of two sides of each connecting portion 14, a supporting portion 16 extends downwardly from the bottom portion of the each side plate 12. Each supporting portion 16 protrudes outwardly from the side plate 12. Each supporting portion 16 comprises a horizontal plate 166 extending outwardly from the side plate 12 and a vertical plate 164 extending downwardly from a free end portion of the horizontal plate 166. A plurality of trapeziform enforcing ribs 168 extends from a top side of each horizontal plate 166 and joins with the side plate 12 of the fan duct 10 to enhance the strength of the supporting portion 16. The first clamping portion 162 is integrally formed with the supporting portion 16. In this embodiment, the first clamping portion 162 is in the form of a column extending from an inner side of the vertical plate 164. The first clamping portions 162 are integrally formed together with the supporting portions 16. Alternatively, the first clamping portions 162 are separately formed and then physically assembled to the supporting portions 16. Being located between the connecting portion 14 and the supporting portion 16, a long vertical cutout 18 is defined from the bottom portion of the side plate 12 to enhance the flexibility of the supporting portion 16. The fan duct 10 further includes an integral, U-shaped fixing portion 19 located at one side thereof for fixing a fan (not shown) therein, whereby an airflow generated by the fan is guidable by the fan duct 10 through the heat sink 20.

The heat sink 20 includes a base plate 22, and a plurality of parallel fins 24 horizontally arranged over the base plate 22. A plurality of heat pipes 26 thermally connect the base plate 22 with the fins 24 and each of the fins 24 defines a plurality of mounting holes (not labeled) therein for receiving the heat pipes 26. Two fastening holes 222 are defined at each of opposite sides of the base plate 22, corresponding to the through holes 142 of the connecting portion 14 of the fan duct 10. Four fasteners (not shown) such as screws, bolts and the like are employed for attaching the fan duct 10 to the heat sink 20 by extending the fasteners through the through holes 142 to threadedly engage in the fastening holes 222.

The mounting frame 30 is attached to a printed circuit board 40 (PCB), and surrounds an electronic component 50 such as a central processing unit (CPU) that is also attached to the PCB 40. The mounting frame 30 includes a base portion 32, and a supporting plate 34 extends inwardly from each of four corners of the base portion 32 for supporting the heat sink 20 thereon. The plurality of second clamping portions 36 are integrally formed from a pair of opposite sides of the base portion 32 located near the supporting plates 34, respectively. Each second clamping portion 36 is in the form of a hook, which extends upwardly from the base portion 32 and then extends outwardly and downwardly to form a barb 362 at its free end. A top surface of the barb 362 of each second clamping portion 36 is arc shaped so as to allow the first clamping portion 162 to slide into engagement with the second clamping portion 36. Each first clamping portion 162 of the fan duct 10 engages with the corresponding second clamping portion 36 of the mounting frame 30; thus, the fan duct 10 is fixed to the mounting frame 30. Since the heat sink 20 is attached to the fan duct 10 by the screws, bolts or the like, as mentioned above, the heat sink 20 is also mounted to the mounting frame 30 after the fan duct 10 is fixedly mounted to the mounting frame 30. The second clamping portion 36 and the first clamping portion 162 are dimensioned so as to engage the heat sink 20 tightly in thermal contact with the electronic component 50.

Figure 2:
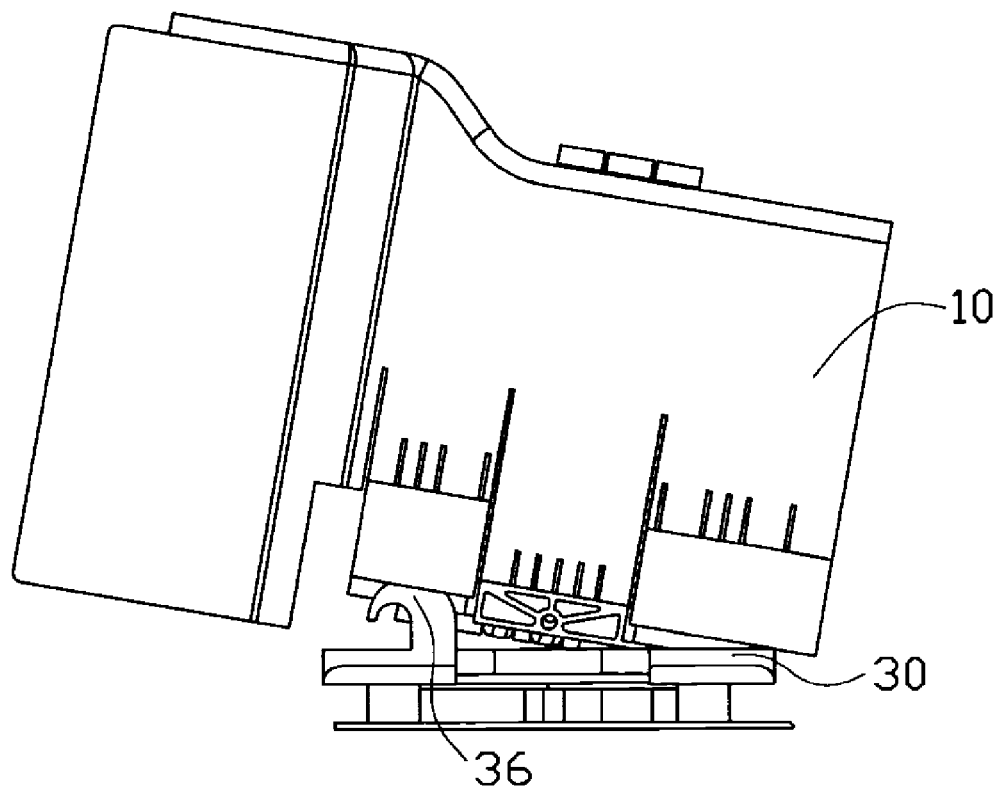
FIG. 2 is a side view of the heat dissipation assembly of FIG. 1 prior to final assembly.
Figure 3:
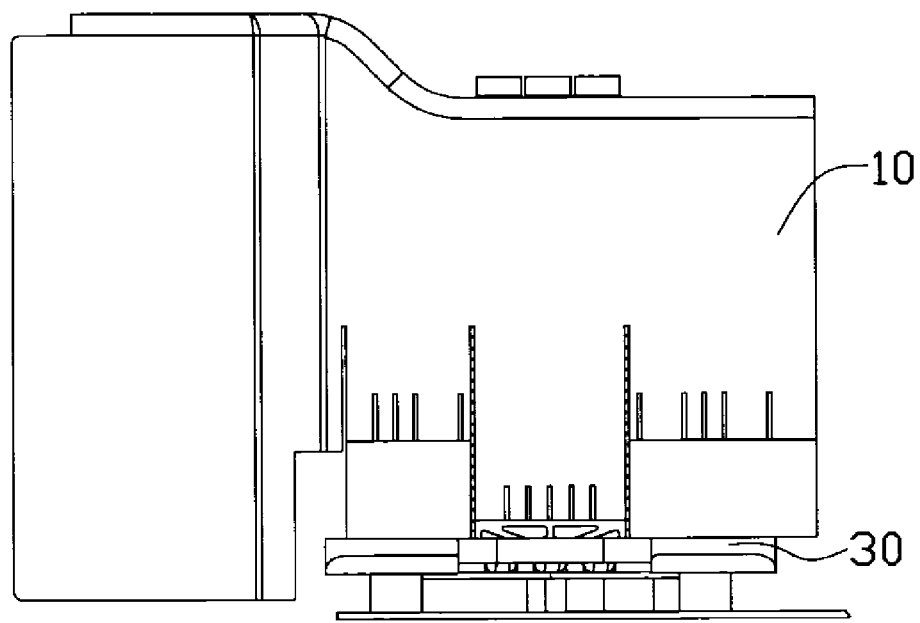
FIG. 3 is a side view of the heat dissipation assembly of FIG. 1 after final assembly.
Figure 4:
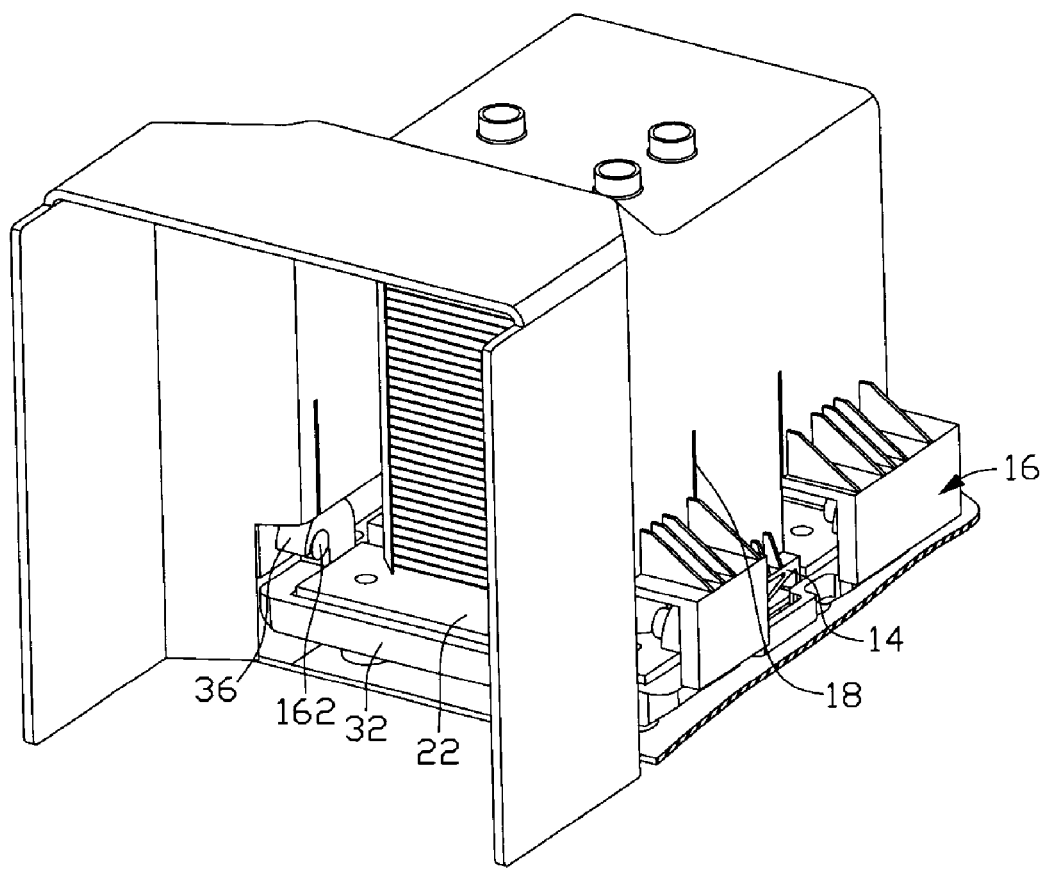
FIG. 4 is an assembled, isometric view of the heat dissipation assembly of FIG. 1.

Referring to FIGS. 2 through 4, in assembly, the fan duct 10 is placed onto the heat sink 20, and the fasteners such as screws or bolts extend through the through holes 142 formed in the side plates 12 of the fan duct 10 and engage in the fastening holes 222 formed in the base plate 22 of the heat sink 20, thereby attaching the fan duct 10 to the heat sink 20 to form a subassembly (not labeled) of the fan duct 10. Referring to FIG. 2, the subassembly of the fan duct 10 and the heat sink 20 is positioned aslant on the mounting frame 30. Two of the first clamping portions 162 are engagingly received in the corresponding second clamping portions 36 of the mounting frame 30. Then the fan duct together with the heat sink 20 therein is pushed downwards to slip the other two of the first clamping portions 162 of the fan duct 10 into the corresponding second clamping portions 36 of the mounting frame 30. Thus, the heat dissipation assembly 100 is fully assembled to the PCB 40. Referring to FIGS. 3 to 4, the engaging force existing between the heat sink 20 and the electronic component 50 pushes the heat sink 20 into intimate thermal engagement with the electronic component 50.

In disassembly of the heat dissipation assembly 100 the supporting portions 16 of the fan duct 10 are pulled outwardly relative to each other to cause the first clamping portions 162 of the supporting portion 16 to disengage from the corresponding second clamping portions 36 of the mounting frame 30.

In assembly and disassembly of the above-mentioned heat dissipation assembly 100 additional clips and tools are not necessary, therefore, the heat dissipation assembly 100 has the advantage of easy assembly and disassembly and of having fewer components.

Additional advantages and modifications will be readily understood by those skilled in the art. Therefore, the invention in its broader aspects is not limited to the specific details and representative embodiments shown and described herein. Accordingly, various modifications may be made without departing from the spirit of scope of the general inventive concept as defined by the appended claims and their equivalents.

What is claimed is:

1. A heat dissipation assembly comprising:
   a mounting frame;
   a heat sink mounted on the mounting frame; and
   a fan duct coupled to the heat sink;
   wherein the fan duct comprises a plurality of first clamping portions, the mounting frame comprises a plurality of second clamping portions corresponding to the first clamping portions, and the first clamping portions engage with the second clamping portions to fix the fan duct and the heat sink onto the mounting frame;
   wherein at least one of the first clamping portions is in the form of a column, and at least one of the second clamping portions is in the form of a hook; and
   wherein an end portion of the at least one of the second clamping portions forms a barb thereat, an outer surface of the barb being arc shaped.

2. The heat dissipation assembly as described in claim 1, wherein the fan duct comprises a top plate and two side plates expending from the top plate, the top plate and the side plates cooperatively enclosing the heat sink therein, and wherein the fan duct further includes a fan-fixing portion located at one side thereof and adapted for fixedly receiving a fan therein.

3. The heat dissipation assembly as described in claim 2, wherein a vertical cutout is formed at each of the two side plates of the fan duct.

4. The heat dissipation assembly as described in claim 2, wherein the heat sink comprises a base plate, the fan duct comprises a connecting portion extending from a bottom portion of each side plate, and the base plate of the heat sink engages with the connecting portion of the fan duct.

5. The heat dissipation assembly as described in claim 1, wherein the mounting frame has a base portion and a supporting plate extending inwardly from each of four corners of the base portion for supporting the heat sink thereon, the second clamping portions being formed upwardly from the base portion of the mounting frame near the supporting plates thereof, respectively.

6. The heat dissipation assembly as described in claim 2, wherein a supporting portion is formed from a bottom portion of each of the side plates of the fin duct, and at least one of the first clamping portions is formed from the supporting portion.

7. A heat dissipation assembly comprising:
   a fan duct having a plurality of first clamping portions thereon;
   a mounting frame having a plurality of second clamping portions thereon, the first clamping portions being engageable with the second clamping portions; and
   a heat sink seated upon the mounting frame and secured to and received in the fan duct, the heat sink including a plurality of fins, airflow through the fins of the heat sink being guidable by the fan duct; wherein
   the first and second clamping portions are dimensioned so that, when the first clamping portions engage with the second clamping portions, an engaging force is generated to push the heat sink downwardly towards the mounting frame;
   wherein the first claming portion is in the form of a column and the second clamping portion is in the form of a hook.

8. The heat dissipation assembly of claim 7, wherein the heat sink includes a base plate from which the fins extend, and the fan duct includes a pair of side plates secured to the base plate of the heat sink.

9. The heat dissipation assembly of claim 8, wherein the heat sink further includes at least one heat pipe thermally connecting the base plate of the heat sink with the fins.

10. The heat dissipation assembly of claim 8, wherein a supporting portion is formed at each of the side plates of the fan duct, the first clamping portions extend from the supporting portions, and a plurality of enforcing ribs is formed between the supporting portion and the side plate.

11. A heat dissipation assembly comprising:

a printed circuit board;

a mounting frame mounted on the printed circuit board, having a plurality of upwardly extending first engaging members;

a heat-generating electronic component mounted on the printed circuit board and surrounded by the mounting frame;

a fan duct having a plurality of second engaging members formed horizontally at a bottom thereof; and a heat sink secured in the fan duct, wherein the first engaging members are interlocked with the second engaging members to make the heat sink have an intimate contact with the heat-generating electronic component.

12. The heat dissipation assembly of claim 11, wherein the second engaging members are horizontally movable to release the interlock between the first engaging members and the second engaging members.

* * * * *